US012701963B2

(12) United States Patent
Amano et al.

(10) Patent No.: US 12,701,963 B2
(45) Date of Patent: Aug. 4, 2026

(54) EXPANDING MACHINE AND EXPANDING METHOD

(71) Applicant: DISCO CORPORATION, Tokyo (JP)

(72) Inventors: Kaoru Amano, Tokyo (JP); Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 517 days.

(21) Appl. No.: 18/319,801

(22) Filed: May 18, 2023

(65) Prior Publication Data

US 2023/0411202 A1 Dec. 21, 2023

(30) Foreign Application Priority Data

May 20, 2022 (JP) ................................. 2022-082837

(51) Int. Cl.
*H10P 72/70* (2026.01)
*B26F 3/04* (2006.01)
*H10P 52/00* (2026.01)

(52) U.S. Cl.
CPC ............ *H10P 72/7402* (2026.01); *B26F 3/04* (2013.01); *H10P 52/00* (2026.01)

(58) Field of Classification Search
CPC ......... H01L 21/67092; H01L 21/67109; H01L 21/67132; H01L 21/67248; H01L 21/68721; G08B 21/18
See application file for complete search history.

(56) References Cited

U.S. PATENT DOCUMENTS

| | | | |
|---|---|---|---|
| 8,691,666 B2 * | 4/2014 | Segawa ................... | H10P 72/74 |
| | | | 438/455 |
| 2014/0127880 A1 * | 5/2014 | Grivna .................... | H10P 54/00 |
| | | | 29/25.01 |
| 2019/0318944 A1 * | 10/2019 | Fujisawa ........... | H01L 21/67098 |
| 2021/0013062 A1 * | 1/2021 | Fujisawa ............. | H10P 72/0431 |
| 2022/0093427 A1 * | 3/2022 | Jang .................. | H01L 21/67383 |
| 2023/0298925 A1 * | 9/2023 | Ueki ................... | H10P 72/7402 |

FOREIGN PATENT DOCUMENTS

| | | | | |
|---|---|---|---|---|
| JP | 2016004832 A | * | 1/2016 | ........ H01L 21/6836 |
| JP | 2019186437 A | | 10/2019 | |
| JP | 2021013035 A | | 2/2021 | |
| JP | 2022048638 A | | 3/2022 | |
| KR | 20210049329 A | * | 5/2021 | ....... H01L 21/67276 |

OTHER PUBLICATIONS

Office Action issued in counterpart German patent application No. 10 2023 204 464.1, dated Jul. 22, 2025.
Office Action issued in counterpart Japanese patent application No. 12022-082837, dated Nov. 13, 2025.

* cited by examiner

*Primary Examiner* — Mohsen Ahmadi
(74) *Attorney, Agent, or Firm* — Greer Burns & Crain Ltd.

(57) ABSTRACT
An expanding machine for expanding a sheet having a workpiece bonded on the sheet. The expanding machine includes an expansion mechanism configured to expand the sheet, a cooling unit that cools the workpiece bonded on the sheet, and a temperature distribution detection unit that, before expanding the sheet by the expansion mechanism, detects a temperature distribution of the workpiece cooled by the cooling unit. A method for expanding a sheet having a workpiece bonded on the sheet is also disclosed.

9 Claims, 8 Drawing Sheets

FIG.5A
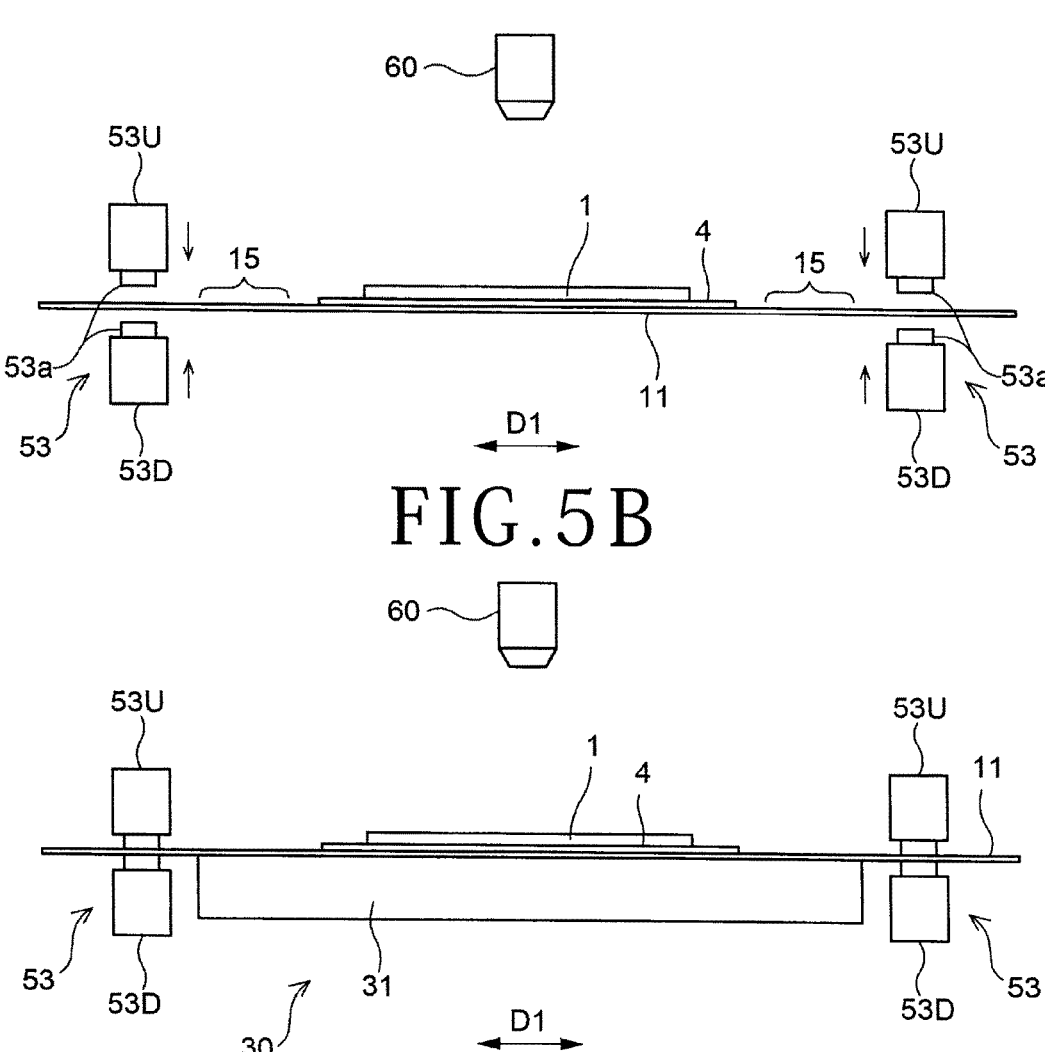
FIG.5B
FIG.5C
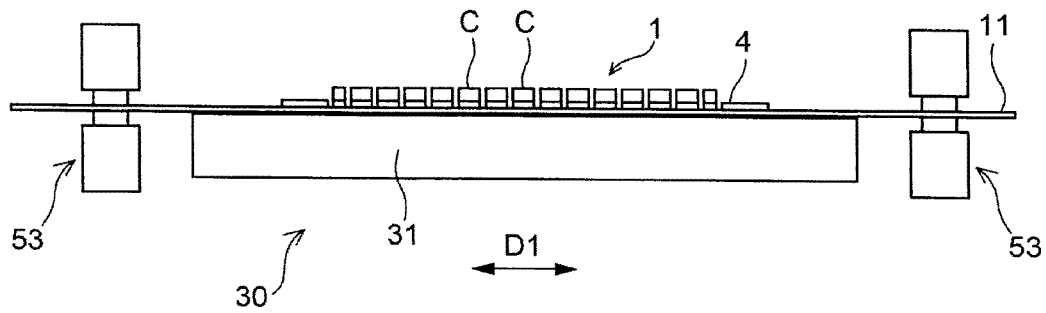

EXPANDING MACHINE AND EXPANDING METHOD

BACKGROUND OF THE INVENTION

Field of the Invention

The present invention relates to an expanding machine and an expanding method for expanding a sheet having a workpiece bonded thereon.

Description of the Related Art

It is known to form a plurality of device chips each with pieces of a die attach film (DAF) bonded to their back surfaces by bonding the DAF to a back surface of a workpiece that carries devices formed in a plurality of regions on its front surface, forming division start points in the workpiece bonded on a sheet via the DAF, and expanding the sheet to divide the workpiece along with the DAF, for example, as in the expanding machine disclosed in Japanese Patent Laid-open No. 2019-186437.

As the DAF has ductility and is hence resistant to tearing at room temperature, the DAF is cooled when expanding the sheet. When dividing a wafer, on which a metal film is stacked, as a workpiece by an expanding machine, the metal film is also cooled beforehand because it has ductility.

For cooling such a DAF or such a metal film on a workpiece, a cooling table such as that disclosed in Japanese Patent Laid-open No. 2019-186437 is used. The cooling table is brought into contact with the sheet, so that cooling of the DAF or the metal film on the workpiece is performed.

SUMMARY OF THE INVENTION

Contaminant such as debris of a workpiece may however occur upon expansion if a cooling table of a configuration such as that disclosed in Japanese Patent Laid-open No. 2019-186437 is used. If this contaminant deposit on the cooling table, the cooling table comes into contact with the sheet with the contaminant held therebetween. In a region or regions where the contaminant is held between the cooling table and the sheet, the DAF or the metal sheet on the workpiece cannot be cooled sufficiently.

It becomes difficult to divide the workpiece in the insufficiently cooled region or regions, possibly resulting in the formation of an undivided region or regions. If the undivided region or regions are once formed, the undivided region or regions remain difficult to be divided even if the sheet is additionally expanded, and this additional expansion merely leads to further expansion of the sheet in regions where the sheet has already been divided.

The present invention therefore has as objects thereof the provision of an expanding apparatus and an expanding method which can prevent the occurrence of a failure in the division of a workpiece.

In accordance with a first aspect of the present invention, there is provided an expanding machine for expanding a sheet having a workpiece bonded thereon. The expanding machine includes an expansion mechanism configured to expand the sheet, a cooling unit that cools the workpiece bonded on the sheet, and a temperature distribution detection unit that, before expanding the sheet by the expansion mechanism, detects a temperature distribution of the workpiece cooled by the cooling unit.

Preferably, the expanding machine may further include an alarm generation unit that generates an alarm, and a controller that controls at least the expansion mechanism and the alarm generation unit. The controller has a determination section configured to determine whether the temperature distribution of the workpiece as detected by the temperature distribution detection unit is abnormal or normal, and the controller is configured to generate the alarm from the alarm generation unit when the temperature distribution of the workpiece is determined to be abnormal by the determination section.

Preferably, the expansion mechanism may include a plurality of sets of opposing sheet clamping units configured to clamp the sheet at opposing positions on an outer periphery of the sheet outside the workpiece, and a plurality of sets of expanding and moving units, each set of expanding and moving units being configured to move the opposing sheet clamping units in directions away from each other in each corresponding set of the opposing sheet clamping units, the cooling unit may include a cooling table having a contact surface configured to come into contact with the sheet clamped by the sheet clamping units and cooling the sheet, and the temperature distribution detection unit may be arranged opposing the workpiece bonded on the sheet clamped by the sheet clamping units, and include an infrared camera to image the workpiece.

In accordance with a second aspect of the present invention, there is provided an expanding method for expanding a sheet having a workpiece bonded thereon. The expanding method includes a cooling step of cooling the workpiece bonded on the sheet, a temperature distribution detecting step of detecting a temperature distribution of the workpiece cooled in the cooling step, a determination step of determining whether the temperature distribution of the workpiece as detected in the temperature distribution detecting step is abnormal or normal, and an expansion step of expanding the sheet if the temperature distribution is determined to be normal in the determination step.

Preferably, the expanding method may further include an alarm generating step of generating an alarm from an alarm generation unit when the temperature distribution of the workpiece is determined to be abnormal in the determination step.

According to the present invention, the determination of a cooling failure before the expansion of a sheet can prevent the occurrence of a failure in the division of the workpiece due to the expansion of the sheet the cooling of which is still insufficient.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 5A is a side view illustrating a clamping step in the expanding method;

FIG. 5B is a side view illustrating a cooling step in the expanding method;

FIG. 5C is a side view illustrating an expanding step in the expanding method;

DETAILED DESCRIPTION OF THE PREFERRED EMBODIMENT

Figure 1:
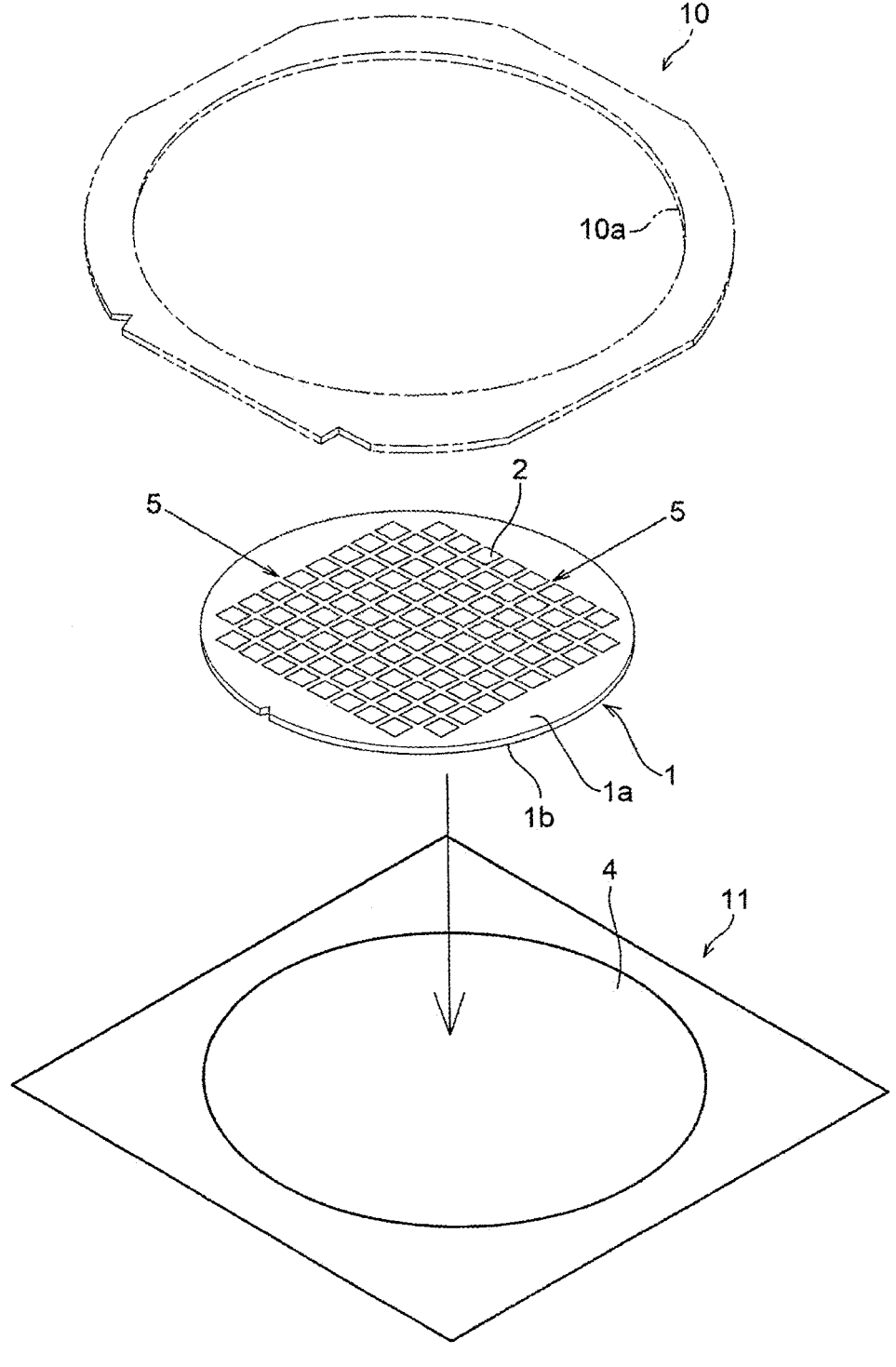
FIG. 1 is a perspective view illustrating how a wafer is bonded to a sheet via an adhesive film.

With reference to the attached drawings, a description will hereinafter be made in detail about an embodiment of the present invention. FIG. 1 illustrates an example of a workpiece 1 to be processed in the present invention. The workpiece 1 may be a semiconductor wafer with devices such as integrated circuits (ICs) or large scale integrated circuits (LSIs) formed on a semiconductor substrate of silicon, gallium arsenide, or the like, or an optical device wafer with optical devices such as light-emitting diodes (LEDs) formed on a substrate of a sapphire-based inorganic material. In addition, the workpiece 1 may also be a substrate of ceramics, glass, or the like.

As illustrated in FIG. 1, a plurality of intersecting scribe lines 5 is set on a front surface 1a of the workpiece 1, and devices 2 are formed in individual regions defined by the respective scribe lines 5.

In the workpiece 1, division start points have been formed along the scribe lines 5. These division start points may be modified layers formed in the workpiece 1 by laser processing, cut grooves formed from the front surface 1a to a predetermined depth of the workpiece 1 by half-cut processing with a cutting blade, or the like.

As an alternative, the workpiece 1 may be one already divided into device chips along the scribe lines 5. Examples may include one having dividing grooves formed by laser ablation processing, one having dividing grooves formed by full-cut processing with a cutting blade, and one divided by dicing before grinding (DBG) processing or stealth dicing before grinding (SDBG) processing.

On a back surface 1b of the workpiece 1, a die attach film (DAF) is bonded as an adhesive film 4. The adhesive film 4 serves to fix, on substrates or the like, device chips individually divided from the workpiece 1. The adhesive film 4 is formed in a circular shape of a larger diameter than the workpiece 1, and the workpiece 1 is bonded on a side of the back surface 1b to the adhesive film 4. The adhesive film 4 (DAF) may also be one having electrical conductivity, more specifically a resin sheet (of epoxy resin or the like) that contains metal particles such as silver particles or Ag nanoparticles. The adhesive film 4 is subsequently to be singulated together with the device chips.

The workpiece 1 is bonded to a sheet 11 (expandable sheet) 11 via the adhesive film 4. It is to be noted that, in FIG. 1, the adhesive film 4 is arranged beforehand on a surface of the sheet 11, and the workpiece 1 is then bonded to the adhesive film 4. As an alternative, an adhesive film layer may be formed by coating a liquid film-forming adhesive to the workpiece 1 or the sheet 11.

A metal film may also be formed on the back surface 1b of the workpiece 1. If this is the case, the workpiece 1 may be directly bonded to the sheet 11 without bonding the adhesive film 4 to the back surface 1b of the workpiece 1. In this case, the metal film on the back surface 1b of the workpiece 1 is directly brought into contact with the sheet 11.

The sheet 11 has stretchability, and includes a base material layer that is made from a synthetic resin such as polyolefin or polyvinyl chloride, and an adhesive layer that is stacked on the base material layer and is to be bonded to the back surface 1b (adhesive film 4) of the workpiece 1 and an annular frame 10. The sheet 11 is formed in a rectangular shape greater than the annular frame 10 in plan. The shape in plan of an opening 10a of the annular frame 10 is defined by a circle of a larger diameter than those of the workpiece 1 and the adhesive film 4. It is to be noted that the annular frame 10 is bonded to the expanded sheet 11 and the spaces between divided device chips themselves are thus maintained by the annular frame 10.

Figure 2:
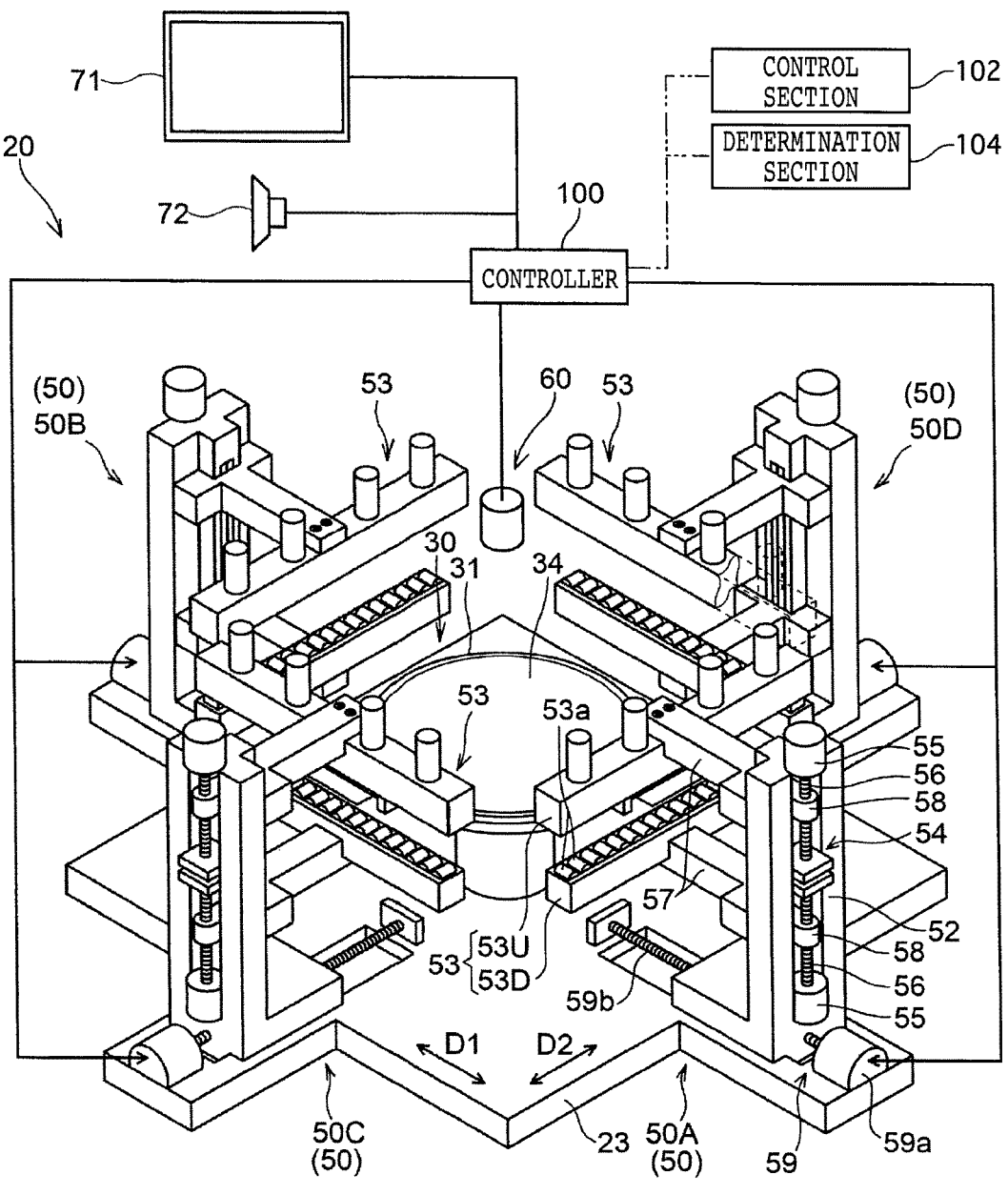
FIG. 2 is a perspective view illustrating a configuration example of an expanding machine according to an embodiment of a first aspect of the present invention.

FIG. 2 is a perspective view illustrating a configuration example of an expanding machine 20 according to an embodiment of the first aspect of the present invention. On the expanding machine 20, the sheet 11 (see FIG. 1) with the workpiece 1 bonded thereon is expanded in a first direction D1, and also in a second direction D2 that is orthogonal to the first direction D1, so that the workpiece 1 (which may hereinafter be also called the "wafer 1") is divided into individual device chips. The expanding machine 20 of this embodiment serves to expand the sheet 11 to which the workpiece 1 is bonded via the adhesive film 4 greater in diameter than the workpiece 1, and to tear the adhesive film 4 along the scribe lines 5 of the workpiece 1.

As illustrated in FIG. 2, the expanding machine 20 mainly includes a plate-shaped fixed bed 23, a cooling unit 30 centrally disposed as cooling and heating means on the fixed bed 23, an expansion mechanism 50, a temperature distribution detection unit 60, and a controller 100.

The expansion mechanism 50 serves to clamp four sides of the sheet 11 with the wafer 1 bonded thereon, and to expand the sheet 11. The expansion mechanism 50 includes four clamping and moving units 50A to 50D arranged at intervals of 90 degrees around the cooling unit 30 in a horizontal plane. The first clamping and moving unit 50A and the second clamping and moving unit 50B are opposing each other along the first direction D1, while the third clamping and moving unit and the fourth clamping and moving unit 50D are opposing each other along the second direction D2.

The individual clamping and moving units to 50D have the same configuration. Described with reference to the first clamping and moving unit 50A, the first clamping and moving unit 50A includes a columnar moving base 52 disposed on the fixed base 23, sheet clamping units 53 (53U and 53D) disposed movably in a vertical direction on the moving base 52, and an up-down moving unit 54 that moves the upper sheet clamping unit 53U and the lower sheet clamping unit 53D in directions toward or away from each other. The upper sheet clamping unit 53U and the lower sheet clamping unit 53D are arranged at an interval from each other in the vertical direction, and are brought toward each other by the up-down moving unit 54 to clamp and hold the sheet 11 therebetween. The up-down moving unit 54 is disposed on the moving base 52.

The up-down moving unit 54 includes a motor that can move a pair of the upper and lower sheet clamping units 53U and 53D in the vertical direction, a ball screw 56 that is rotated about an axis thereof by the motor 55, and nuts 58 that are in threaded engagement with the ball screw 56 and are connected to the upper and lower sheet clamping units 53U and 53D via arm members 57. By rotating the ball screw 56 about its axis with the motor 55, the up-down moving unit 54 moves the nuts 58, the arm members 57, and the upper and lower sheet clamping units 53U and 53D in the vertical direction.

By rotating the ball screws 56 about their axes with the motors 55, the up-down moving units 54 can also move the upper and lower sheet clamping units 53U and 53D vertically in the same direction. The sheet 11 can therefore be moved in the vertical direction relative to the cooling unit 30 by raising the upper and lower sheet clamping units 53U and 53D with the up-down moving units 54, while the sheet 11 is being kept clamped. It is to be noted that the expanding machine 20 may also be configured to move the sheet 11 relative to the upper and lower sheet clamping units 53U and 53D in the vertical direction by lifting up or lowering a disk-shaped cooling table 31 of the cooling unit 30.

Each sheet clamping unit 53 has the upper sheet clamping unit 53U and the lower sheet clamping unit 53D, which are opposing each other in an up-and-down relation. These upper and lower sheet clamping units 53U and 53D include pluralities of rollers 53a which are opposing each other in an up-and-down relation to clamp the sheet 11 therebetween. These rollers 53a are configured to freely rotate in a direction orthogonal to a direction in which the sheet 11 is expanded, and are able to expand the sheet 11 while clamping the sheet 11.

The moving base 52 of the first clamping and moving unit 50A is disposed movably in the first direction D1 relative to the fixed bed 23 by a corresponding expanding and moving unit 59. The expanding and moving unit 59 has a motor 59a and a ball screw 59b that is rotated by the motor 59a. When the ball screw 59b is driven and rotated by the motor 59a, the moving base 52 is moved in the first direction D1.

Owing to the above-described configuration, the first and second clamping and moving units 50A and are moved in directions away from each other along the first direction D1, and the third and fourth clamping and moving units 50C and 50D are moved in directions away from each other along the second direction D2, whereby the sheet 11 clamped by the respective upper and lower sheet clamping units 53U and 53D is expanded.

In the expansion mechanism 50 of FIG. 2, the four sets of sheet clamping units 53 and the four sets of expanding and moving units 59 are combined together, respectively, so that the 4 sets of first, second, third and fourth clamping and moving units 50A to are configured. However, the number of such clamping and moving mechanisms is not limited to four sets. The expansion mechanism 50 may include, for example, a desired plurality of sets of opposing sheet clamping units configured to clamp a sheet 11 at opposing positions on an outer periphery of the sheet 11 outside the workpiece 1, and a like desired plurality of sets of expanding and moving units, each set of expanding and moving units being configured to move the opposing sheet clamping units in directions away from each other in each corresponding set of opposing sheet clamping units.

Figure 3:
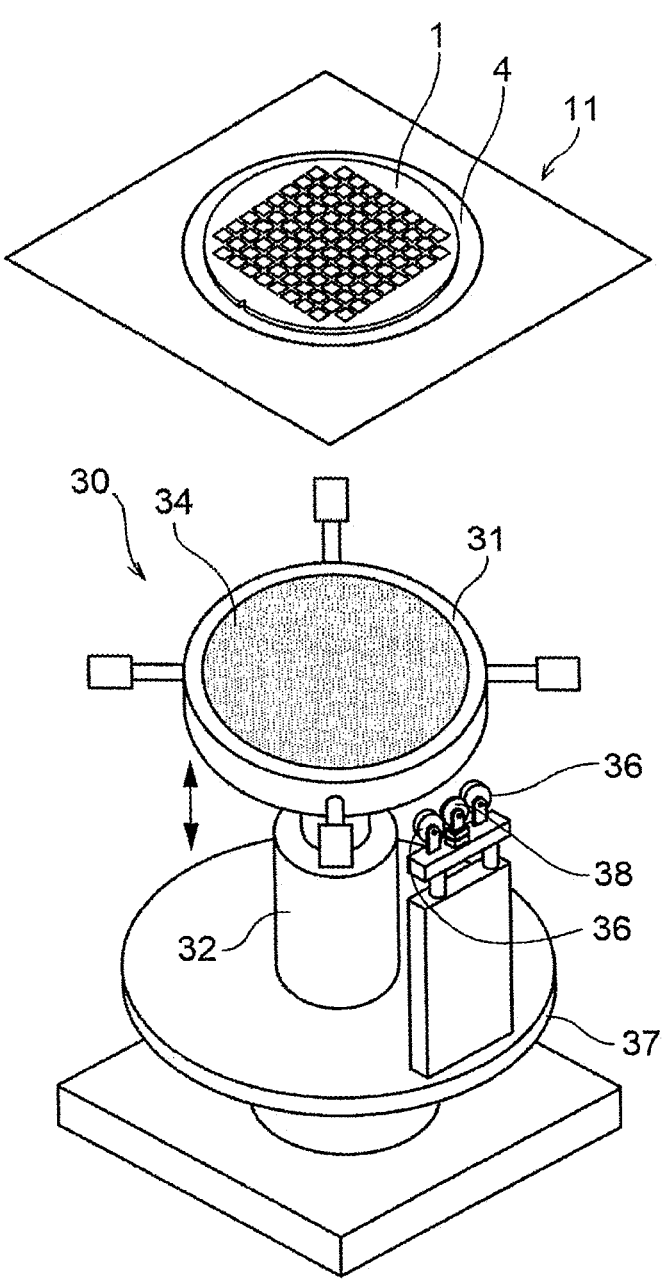
FIG. 3 is a perspective view illustrating the configuration of a cooling unit of the expanding machine.

Before expanding the sheet 11, cooling of the sheet 11 is performed by the cooling unit 30 illustrated in FIGS. 2 and 3. The cooling unit 30 includes the disk-shaped cooling table 31, and a Peltier device system (not illustrated) that selectively performs heating or cooling of the cooling table 31. It is to be noted that the shape of the cooling table 31 is not limited to such a disk shape, and may be, for example, a rectangular shape.

As illustrated in FIG. 3, the cooling table 31 of the cooling unit 30 has an upper surface 34 formed planar along a horizontal direction. When the upper surface 34 of the cooling table 31 is brought into contact with a back surface of the sheet 11, the adhesive film 4 and the workpiece 1 are cooled via the sheet 11. The cooling table 31 is moved in an up-down direction by a lift mechanism 32.

As illustrated in FIG. 2, the temperature distribution detection unit 60 is arranged above the cooling table 31 of the cooling unit 30. The temperature distribution detection unit 60 includes an infrared camera. The infrared camera is arranged opposing the workpiece 1 that is bonded on the sheet 11 clamped by the respective sheet clamping units 53, and images the workpiece 1. The temperature distribution detection unit 60 includes an infrared thermographic camera, and can detect a temperature distribution of the workpiece 1 cooled by the cooling unit 30.

As illustrated in FIG. 2, the expanding machine 20 is provided with a display monitor 71 and a speaker 72, which function as an alarm generation unit to generate an alarm when there is an abnormality in the temperature distribution of the workpiece 1 cooled by the cooling unit 30.

The controller 100 controls the cooling unit 30, the expansion mechanism 50 (clamping and moving units 50A to 50D), and the temperature distribution detection unit 60, so that the temperature distribution of the workpiece 1 is detected before expanding the sheet 11, and the expansion of the sheet 11 is performed if the temperature distribution detected is determined to be normal as will be described below. The controller 100 has a control section 102 for controlling the individual units, and a determination section 104 that performs a determination as to whether the temperature distribution of the workpiece 1 is normal or abnormal.

Figure 4:
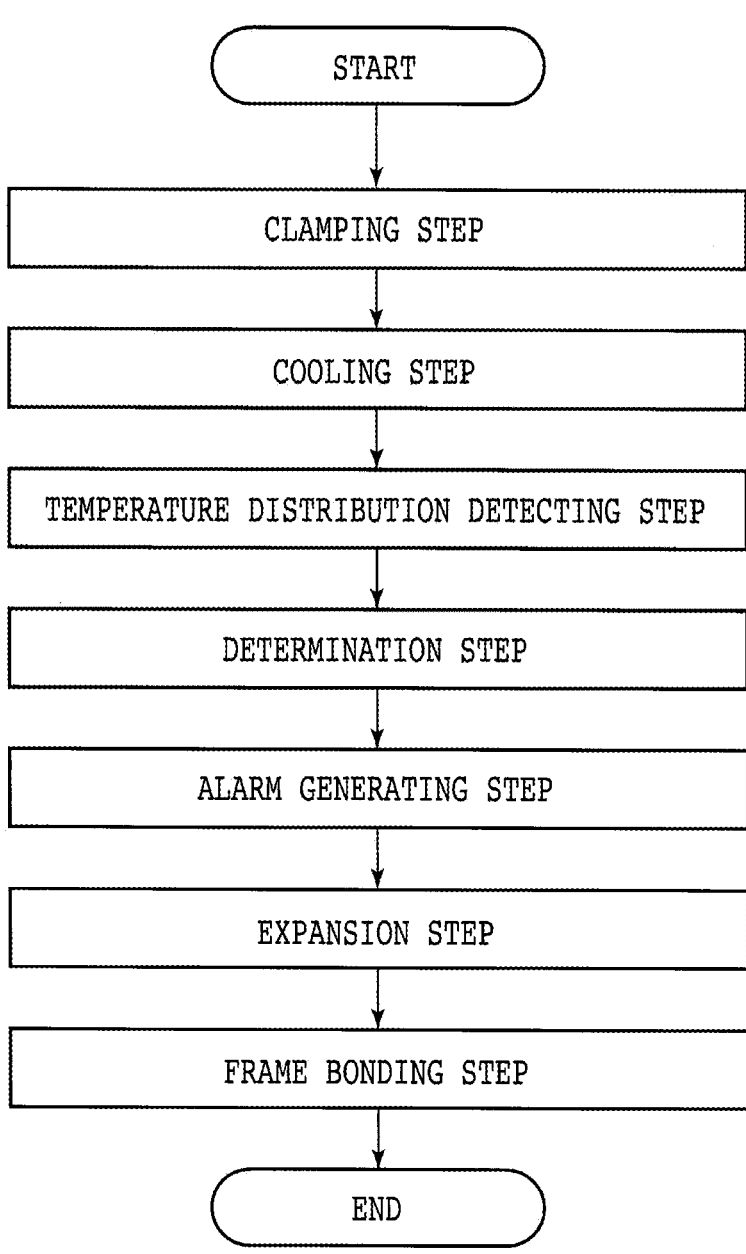
FIG. 4 is a flow chart illustrating a flow of an expanding method according to an embodiment of a second aspect of the present invention.

A description will next be made about the expanding method according to this embodiment for the sheet 11, in which the above machine configuration is used. FIG. 4 is a flow chart illustrating individual steps of the expanding method of this embodiment.

<Clamping Step>

This step is to clamp the sheet 11 by the sheet clamping units 53 at positions outside the workpiece 1 as illustrated in FIG. 5A. In FIG. 5A, the sheet clamping units 53 that are opposing each other in the first direction D1 are illustrated. The sheet 11 is similarly clamped by the sheet clamping units 53 that are opposing each other in the second direction D2 (see FIG. 2).

In the workpiece 1, division start points have been formed along the scribe lines 5. As an alternative, the workpiece 1 has been divided into device chips along the scribe lines 5. The workpiece 1 has been bonded to the sheet 11 via the adhesive film 4.

On the sheet 11, the annular frame 10 (see FIG. 7C) is subsequently to be bonded in a frame bond region 15 between the adhesive film 4 and the sheet clamping units 53.

<Cooling Step>

This step is to cool the workpiece 1 bonded on the sheet 11 as illustrated in FIG. 5B. Specifically, the cooling table 31 of the cooling unit 30 is brought into contact with the side of the back surface of the sheet 11, and the adhesive film 4 and the workpiece 1 are cooled via the sheet 11. By this cooling, improvements are made in the tear properties of the adhesive film 4, and also in the tear properties of a metal film on the workpiece 1 if the metal film has been formed.

However, no contact may be made between the cooling table 31 of the cooling unit 30 and the side of the back surface of the sheet 11. If this is the case, the adhesive film 4 and the workpiece 1 may be cooled by a cooling system different from the cooling unit 30. For example, an expanding machine may be housed in a cooling chamber, and the atmospheric temperature in the cooling chamber may be lowered to cool the adhesive film 4 and the workpiece 1.

<Temperature Distribution Detecting Step>

This step is to detect a temperature distribution of the workpiece 1 cooled by the cooling unit 30 as illustrated in FIG. 5B. Specifically, the upper surface of the workpiece 1 is imaged by the temperature distribution detection unit 60, and the temperature distribution of the workpiece 1 is detected by infrared thermography.

Figure 6A:
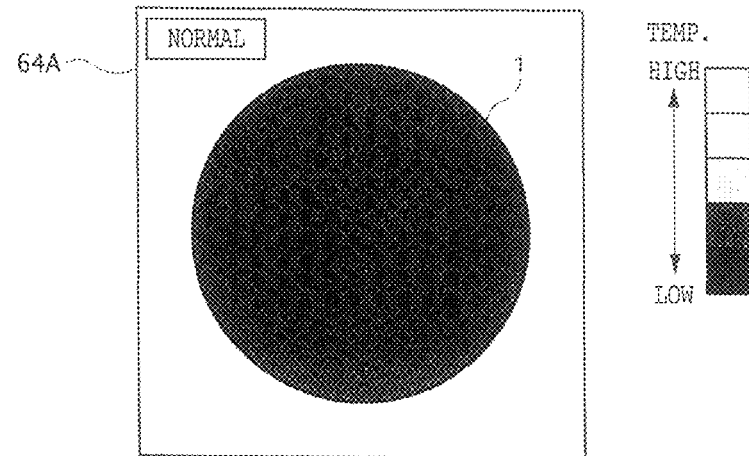
FIG. 6A is a diagram illustrating an example of a thermogram where a temperature distribution of a workpiece is determined to be normal in a determination step of the expanding method.

FIG. 6A illustrates a thermogram 64A detected by infrared thermography. In the thermogram 64A, the whole workpiece 1 is illustrated in the same color, thereby indicating that the workpiece 1 is detected to have been cooled at a uniform temperature. In a thermogram 64B of FIG. 6B, on the other hand, the color is not uniform in the whole workpiece 1, thereby indicating a detection of insufficiently cooled regions 1X higher in temperature than other areas.

Figure 6B:
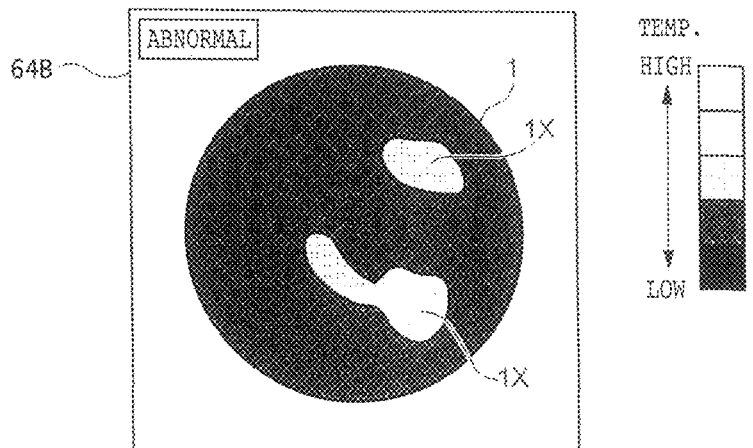
FIG. 6B is a diagram illustrating an example of a thermogram where a temperature distribution of a workpiece is determined to be abnormal in the determination step.

The thermograms 64A and 64B of FIGS. 6A and 6B are each displayed on the display monitor 71 illustrated in FIG. 2. Therefore, a worker can confirm the cooling state of each workpiece 1, and can also specify the insufficiently cooled areas. It is to be noted that insufficient cooling occurs, for example, if contaminant is held between the cooling table 31 and the sheet 11 in FIG. 5B, or in a like situation.

<Determination Step>

This step is to determine whether the detected temperature distribution of the workpiece 1 is abnormal or normal. If the color is not uniform in the temperature distribution of the workpiece 1, specifically, the temperature is high in one or more regions, for example, as illustrated in the thermogram 64B of FIG. 6B, the determination section 104 of the controller 100 (see FIG. 2) concludes that insufficient cooling has occurred in the one or more regions and there are one or more insufficiently cooled regions 1X, and therefore determines the temperature distribution to be abnormal.

If the color is uniform in the temperature distribution of the workpiece 1 as illustrated in the thermogram 64A of FIG. 6A, on the other hand, the determination section 104 of the controller 100 (see FIG. 2) concludes that the cooling has been appropriately performed, and therefore determines the temperature distribution to be normal.

Figure 6C:
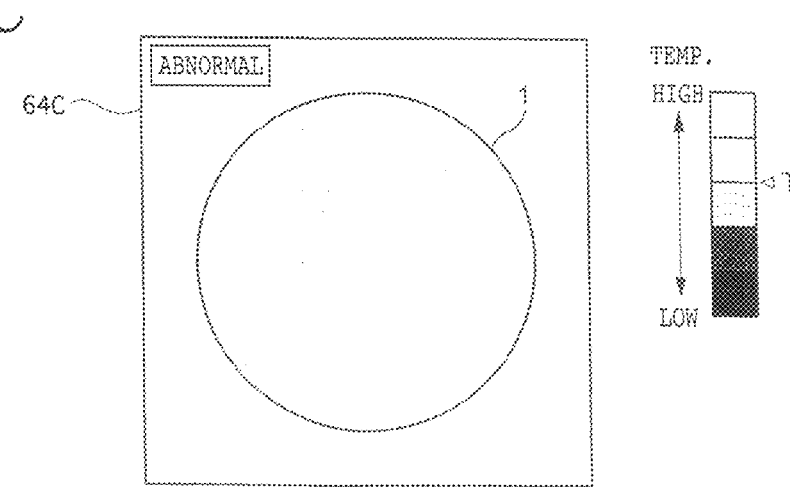
FIG. 6C is a diagram illustrating an example of a thermogram where, in the determination step, insufficient cooling is determined to have occurred over the entirety of a workpiece.

In addition to a determination of abnormality if the temperature is high in one or more insufficiently cooled regions 1X as in the example of FIG. 6B, abnormality may also be determined despite a uniform temperature if, as in the example of FIG. 6C, the workpiece 1 as a whole is high in temperature and insufficient cooling has occurred over its entirety. Specifically, a specified temperature T1 may be set as in the example of FIG. 6C, and if the temperature is higher than the specified temperature T1, abnormality may then be determined.

<Alarm Generating Step>

This step is to have an alarm generated from the alarm generation unit when the temperature distribution of the workpiece 1 is determined to be abnormal at the determination section 104 (see FIG. 2). Specifically, the controller 100 makes the display monitor 71 (see FIG. 2) display that the cooled state of the workpiece 1 is abnormal, and also makes the speaker 72 generate an alarm sound.

On the basis of the alarm, the worker can stop the operation of the expanding machine 20, and can then take necessary actions such as checking for existence of contaminant between the cooling table 31 and the sheet 11 and cleaning of the cooling table 31.

<Expansion Step>

This step is to expand the sheet 11 as illustrated in FIG. 5C if the temperature distribution is determined to be normal in the determination step. Specifically, as illustrated in FIG. 5C, the sheet clamping units 53 that are opposing each other in the first direction D1 are moved in directions away from each other along the first direction D1. Although not illustrated in FIG. 5C, the sheet clamping units 53 that are opposing each other in the second direction D2 (see FIG. 2) are also moved similarly in directions away from each other along the second direction D2. As a result, the sheet 11 is expanded, and the adhesive film 4 is hence torn along the scribe lines 5. Here, the adhesive film 4 and the workpiece 1 have been uniformly cooled, and no variations exist in the degree of cooling, so that the tearing along the scribe lines 5 is achieved appropriately, and the occurrence of a tearing failure is suppressed.

As illustrated in FIG. 5C, the workpiece 1 is also concurrently divided and singulated into device chips C if division start points have been formed in the workpiece 1, or spaces are formed between adjacent respective device chips C if the workpieces has already been divided.

<Frame Bonding Step>

Figure 7A:
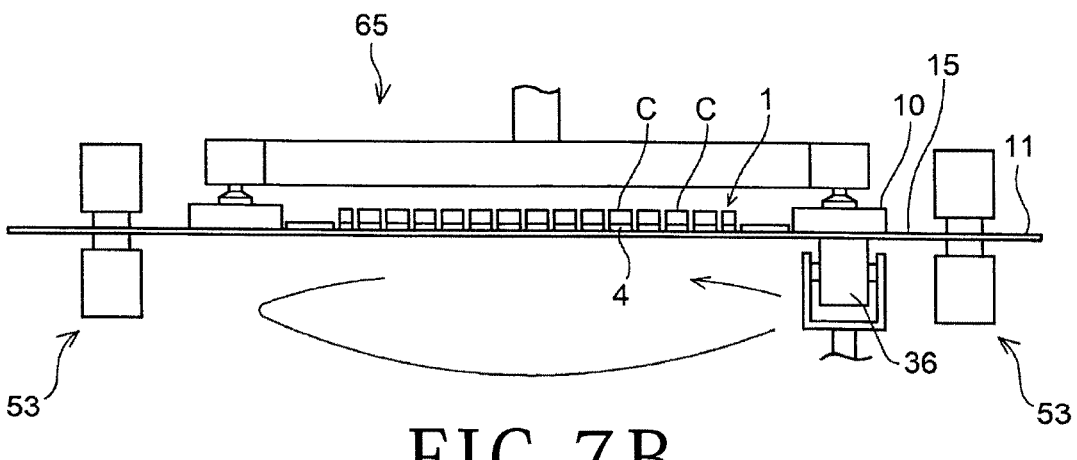
FIG. 7A is a side view illustrating a frame bonding step in the expanding method.

As illustrated in FIG. 7A, this step is to bond the annular frame 10 to the frame bond region 15 after performing the expansion step. Specifically, the annular frame 10 is transferred by a frame transfer unit 65, and is bonded to the frame bond region 15 such that the workpiece 1 is surrounded by the opening 10a of the annular frame 10.

Also as illustrated in FIG. 7A, frame bonding rollers 36 are then pressed from a back side of the sheet 11 so that the annular frame 10 and the sheet 11 are more firmly bonded together. As illustrated in FIG. 3, for example, the frame bonding rollers 36 are disposed on a rotary table 37 in such a manner that they are located beside the cooling table 31 of the cooling unit 30. When the rotary table 37 is rotated over 360 degrees, the frame bonding rollers 36 is caused to revolve in a circle as indicated by an arrow in FIG. 7A, thereby pushing the sheet 11 up from the back side thereof.

Figure 7B:
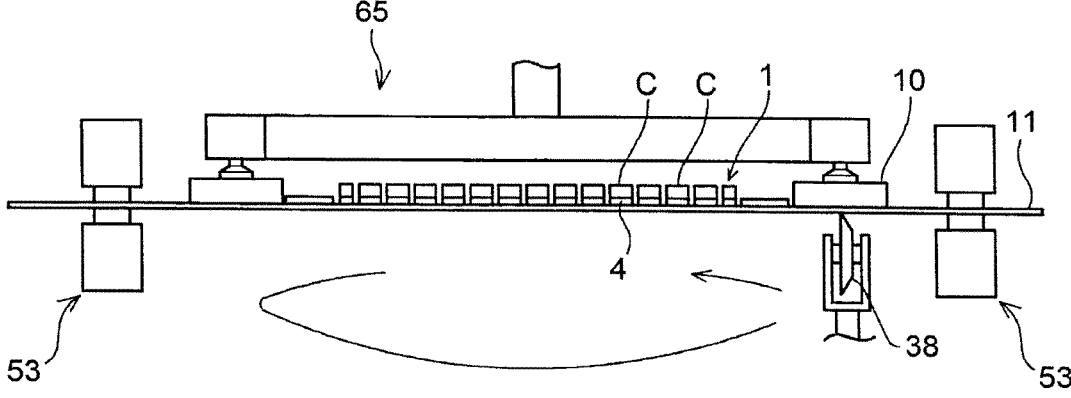
FIG. 7B is a side view illustrating cutting of a sheet after the frame bonding step.

As illustrated in FIG. 7B, a sheet cutter 38 is next brought into contact with the sheet 11 from the back side of the sheet 11, so that the sheet 11 is cut in a peripheral direction at a location where the annular frame 10 is bonded on the sheet 11 and along a circle corresponding to a substantial center in a width direction of the annular frame 10. The sheet cutter 38 is configured of a disk-shaped cutter, for example, and is disposed on the rotary table 37 in such a manner that the sheet cutter 38 is located beside the cooling table 31 of the cooling unit 30 as illustrated in FIG. 3. When the rotary table 37 is rotated over 360 degrees, the sheet cutter 38 therefore cuts the sheet 11 in the peripheral direction.

Figure 7C:
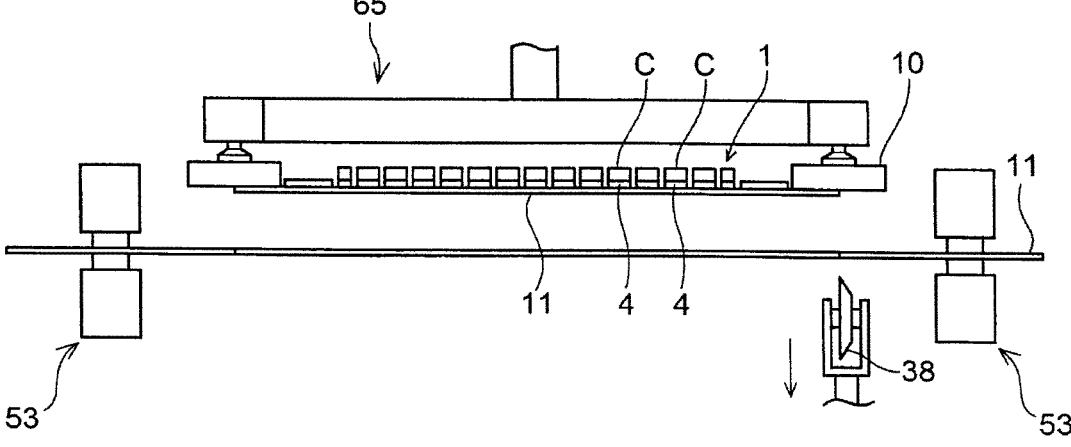
FIG. 7C is a side view illustrating unloading of a wafer bonded on the sheet after the cutting of the sheet.

As illustrated in FIG. 7C, the frame transfer unit 65 is next lifted up to unload the workpiece 1 that is now integrated with the sheet 11.

By determining a cooling failure before the expansion of the sheet 11 as described above, it is possible to prevent the occurrence of a failure in the division of the workpiece 1 due to the expansion of the sheet 11 the cooling of which is still insufficient.

Figure 8:
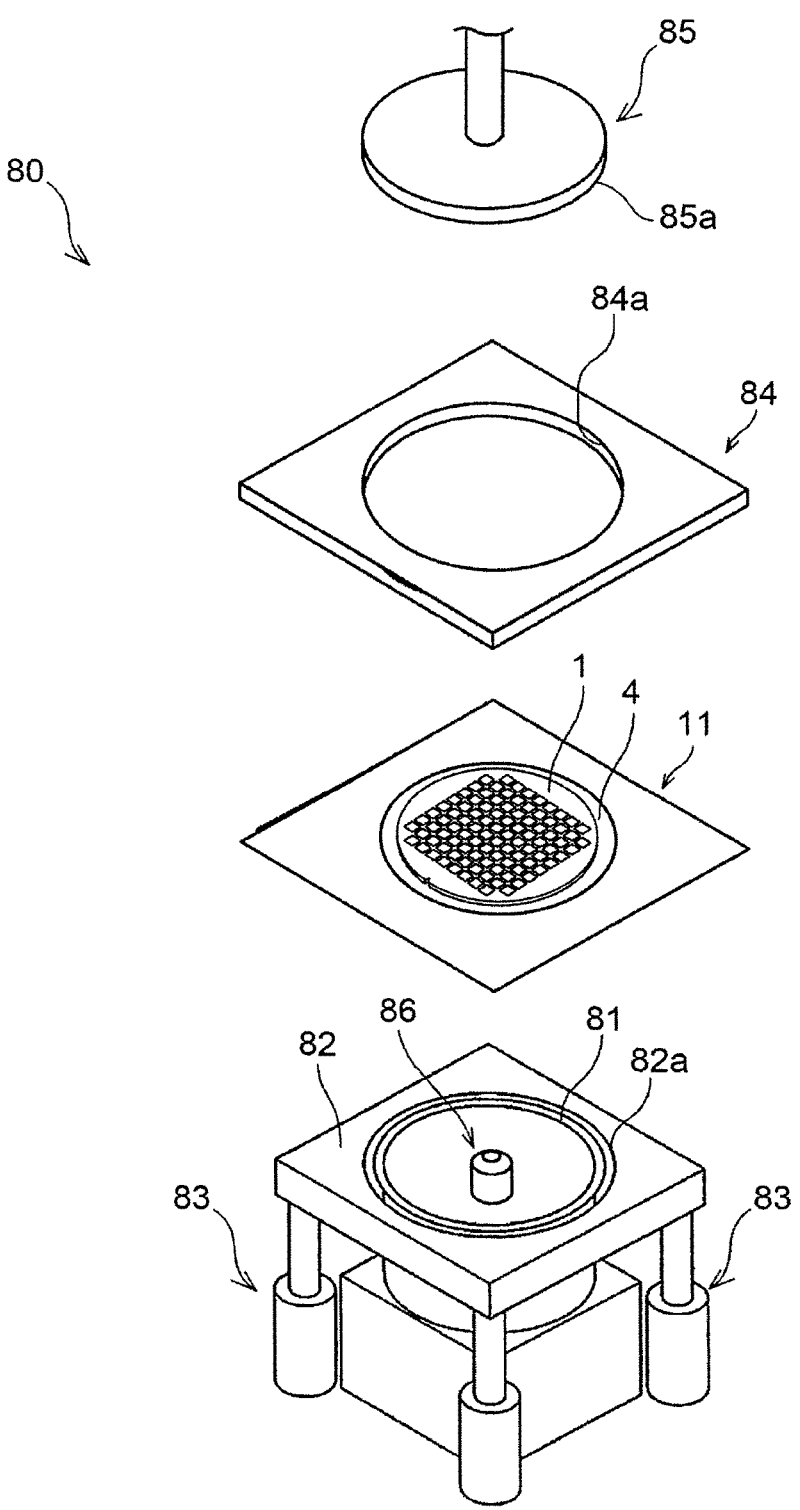
FIG. 8 is an exploded perspective view illustrating a modification of the expanding machine of FIG. 2.

The present invention can also be practiced with the configuration of an expanding machine 80 illustrated in FIG. 8 as a modification of the expanding machine 20 of the embodiment illustrated in FIG. 2. In the configuration illustrated in FIG. 8, the expanding machine 80 includes an expansion mechanism, a cooling unit 85, and a temperature distribution detection unit 86. The expansion mechanism has an expansion drum 81, a lower plate 82, lift mechanisms 83, and an upper clamping plate 84, and expands a sheet 11. The cooling unit 85 cools a workpiece 1 bonded on the sheet 11. The temperature distribution detection unit 86 detects a temperature distribution of the workpiece 1, which has been cooled by the cooling unit 85, before expanding the sheet 11 by the expansion mechanism.

The lower plate 82 is lifted up or lowered by the lift mechanisms 83 disposed at four locations, respectively, and is moved up or down relative to the expansion drum 81 accommodated in a central opening 82a of the lower plate 82.

The upper plate 84 serves to clamp the sheet 11 between itself and the lower plate 82. In the upper plate 84, an opening 84a is formed with a diameter greater than an adhesive film 4 and the workpiece 1, so that a cooling plate 85a of the cooling unit 85 can be placed opposite the workpiece 1 through the opening 84a. Cold air is blown out from the cooling plate 85a, and the workpiece 1 and the adhesive film 4 are cooled with the cold air. Instead of configuring to cool the adhesive film 4 and the workpiece 1 by the cooling unit 85, the adhesive film 4 and the workpiece 1 may also be cooled, for example, by housing the expansion drum 81, the lower plate 82, the lift mechanisms 83, and the upper clamping plate 84 in a cooling chamber, and lowering the atmospheric temperature in the cooling chamber.

In the expansion drum 81, the temperature distribution detection unit 86 is disposed opposing the workpiece 1 from the lower side via the sheet 11.

In the above-described configuration, the sheet 11 is clamped between the upper plate 84 and the lower plate 82, and the workpiece 1 and the adhesive film 4 are cooled by the cooling unit 85. By the temperature distribution detection unit 86, a determination is then made as to whether the temperature distribution is abnormal or normal.

If determined to be abnormal, checking is appropriately performed for the occurrence of a failure or the like of the cooling unit 85. By determining a cooling failure before the expansion of the sheet 11 as described above, it is possible to prevent the occurrence of a failure in the division of the workpiece 1 due to the expansion of the sheet 11 the cooling of which is still insufficient.

If determined to be normal, on the other hand, the lower plate 82 and the upper plate 84 are integrally lifted down together. The sheet 11 is hence pulled down against the expansion drum 81, whereby the sheet 11 is expanded to divide the workpiece 1.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An expanding machine for expanding a sheet having a workpiece bonded thereon, comprising:

an expansion mechanism configured to expand the sheet;

a cooling unit that cools the workpiece bonded on the sheet; and a temperature distribution detection unit that, before expanding the sheet by the expansion mechanism, detects a temperature distribution of the workpiece cooled by the cooling unit, and a controller that controls at least the expansion mechanism, wherein the controller has a determination section configured to determine whether the temperature distribution of the workpiece as detected by the temperature distribution detection unit is abnormal or normal, wherein a specified temperature is set within the controller, and when a temperature of the workpiece is higher than the specified temperature, the determination section determines the temperature distribution to be abnormal, and wherein expansion of the sheet is performed only when the temperature distribution detected is determined to be normal.

2. The expanding machine according to claim 1, further comprising:

an alarm generation unit that generates an alarm;

wherein the controller controls the alarm generation unit, and wherein the controller is configured to generate the alarm from the alarm generation unit when the temperature distribution of the workpiece is determined to be abnormal by the determination section.

3. The expanding machine according to claim 1, wherein the expansion mechanism includes a plurality of sets of opposing sheet clamping units configured to clamp the sheet at opposing positions on an outer periphery of the sheet outside the workpiece, and a plurality of sets of expanding and moving units, each set of expanding and moving units being configured to move the opposing sheet clamping units in directions away from each other in each corresponding set of the opposing sheet clamping units, the cooling unit includes a cooling table having a contact surface configured to come into contact with the sheet clamped by the sheet clamping units and cooling the sheet, and the temperature distribution detection unit is arranged opposing the workpiece bonded on the sheet clamped by the sheet clamping units, and includes an infrared camera to image the workpiece.

4. The expanding machine according to claim 1, further comprising:

a rotary table including:

frame bonding rollers which press a back side of the sheet so that the annular frame and the sheet are more firmly bonded together; and a sheet cutter which is brought into contact with the sheet from the back side of the sheet, so that the sheet is cut in a peripheral direction at a location where the annular frame is bonded on the sheet and along a circle corresponding to a substantial center in a width direction of the annular frame.

5. The expanding machine according to claim 1, wherein the controller determines the temperature distribution to be abnormal when the temperature of the workpiece is non-uniform across the workpiece.

6. The expanding machine according to claim 1, wherein the controller determines the temperature distribution to be abnormal when one or more regions of the workpiece have a temperature higher than other regions of the workpiece.

7. The expanding machine according to claim 1, further comprising:

a display monitor which is configured to display a thermogram representing the temperature distribution of the workpiece detected by the temperature distribution detection unit, wherein the thermogram visually indicates whether the temperature distribution of the workpiece is uniform or non-uniform.

8. The expanding machine according to claim 7, wherein the thermogram displays insufficiently cooled regions of the workpiece in a color different from other regions of the workpiece.

9. The expanding machine according to claim 1, wherein the cooling unit includes a cooling table configured to be brought into contact with a back surface of the sheet to cool the workpiece via the sheet.

\* \* \* \* \*